(12) United States Patent
Dahl et al.

(10) Patent No.: US 6,553,554 B1
(45) Date of Patent: Apr. 22, 2003

(54) METHOD AND SYSTEM FOR IMPLEMENTING A GRAPHICAL USER INTERFACE FOR DEPICTING LOOSE FLY LINE INTERCONNECTIONS BETWEEN MULTIPLE BLOCKS OF AN INTEGRATED CIRCUIT NETLIST

(75) Inventors: Peter Dahl, Cupertino, CA (US); Byron Dickinson, San Jose, CA (US); Margie Levine, Menlo Park, CA (US); Paul Rodman, Palo Alto, CA (US)

(73) Assignee: Reshape, Inc., Mountain View, CA (US)

(*) Notice: Subject to any disclaimer, the term of this patent is extended or adjusted under 35 U.S.C. 154(b) by 0 days.

(21) Appl. No.: 09/908,957

(22) Filed: Jul. 18, 2001

Related U.S. Application Data

(63) Continuation of application No. 09/714,296, filed on Nov. 15, 2000.

(51) Int. Cl.$^7$ .............................................. G06F 9/455
(52) U.S. Cl. ................... 716/11; 716/8; 716/9; 716/10
(58) Field of Search .......................... 716/8–11, 12–16; 703/6, 14, 22

(56) References Cited

U.S. PATENT DOCUMENTS 5,627,999 A * 5/1997 Cheng et al. ................ 716/8
6,360,191 B1 * 3/2002 Koza et al. .................. 703/6

* cited by examiner

*Primary Examiner*—Vuthe Siek
*Assistant Examiner*—Naum Levin
(74) *Attorney, Agent, or Firm*—Wagner, Murabito & Hao LLP

(57) ABSTRACT

A method and system for implementing a user interface for performing physical design operations on an integrated circuit netlist. The method includes the step of accessing vertical and horizontal dimensions of an area of an integrated circuit netlist. A grid for power and ground lines of the integrated circuit netlist is then accessed. A view of the grid is presented to a user, wherein the view is provided by a computer display. A plurality of blocks of cells of the integrated circuit netlist are accessed, with each block representing circuit components to be realized in physical form. The dimensions of the plurality of blocks are snapped to the grid such that the dimensions of the blocks align with the grid.

18 Claims, 18 Drawing Sheets

1400

```
ACCESS AN INPUT FILE OF AN INTEGRATED CIRCUIT NETLIST
1401
```

↓

```
EXAMINE THE INPUT FILE TO USING A PARSER PROGRAM TO IDENTIFY
ELEMENTS MATCHING CORRESPONDING ELEMENTS WITHIN A MASTER
LIBRARY FILE
1402
```

↓

```
IDENTIFY AT LEAST ONE ELEMENT, WHEREIN THE ELEMENT DOES NOT
HAVE A CORRESPONDING ELEMENT WITHIN THE MASTER LIBRARY FILE
1403
```

↓

```
STORE A MODIFIABLE ELEMENT CORRESPONDING TO THE AT LEAST ONE
ELEMENT WITHIN A MODIFIABLE MASTER LIBRARY FILE
1404
```

↓

```
IDENTIFY A SUBSEQUENT OCCURRENCE OF THE AT LEAST ONE ELEMENT
IN THE NETLIST AND MATCH THE AT LEAST ONE ELEMENT TO THE
CORRESPONDING MODIFIABLE ELEMENT IN THE MODIFIABLE MASTER
LIBRARY FILE AND EXTEND THE MODIFIABLE ELEMENT AS NEEDED
1405
```

↓

```
COMPLETE THE PARSING OF THE INPUT FILE
1406
```

↓

```
COMPLETE THE BUILD OF THE NETLIST BASED ON THE PARSED INPUT
FILE AND THE SPECIFICATIONS STORED IN THE LIBRARIES
1407
```

FIGURE 14

METHOD AND SYSTEM FOR IMPLEMENTING A GRAPHICAL USER INTERFACE FOR DEPICTING LOOSE FLY LINE INTERCONNECTIONS BETWEEN MULTIPLE BLOCKS OF AN INTEGRATED CIRCUIT NETLIST

This is a continuation of copending application(s) Ser. No. 09/714,296 filed on Nov. 15, 2000 which is hereby incorporated by reference to this specification which designated the U.S.

This application is related to copending applications entitled "OPTIMIZATION OF ABUTTED PIN HIERARCHICAL PHYSICAL DESIGN" by Dahl et al., filed on Nov. 15, 2000, Ser. No. 09/714,722 and "METHOD AND SYSTEM FOR AUTOMATICALLY GENERATING LOW LEVEL PROGRAM COMMANDS AS DEPENDENCY GRAPHS FROM HIGH LEVEL PHYSICAL DESIGN STAGES" by Levine et al., filed on Nov. 13, 2000, Ser. No. 09/712,418, which are both incorporated herein by reference.

FIELD OF THE INVENTION

The present invention relates to the field electronic design automation (EDA). More specifically, embodiments of the present invention relate to an EDA system having an improved physical design system for hierarchical integrated circuit designs.

BACKGROUND ART

An electronic design automation (EDA) system is a computer system used for designing integrated circuit (IC) devices. The rapid growth of the complexity of modem electronic circuits has forced electronic circuit designers to rely upon computer programs to assist or automate most steps of this design process. Typical circuits today contain hundreds of thousands or millions of individual pieces or "cells." Such a design is too large for a circuit designer or even an engineering team of designers to manage effectively without computer systems.

In general, the EDA system typically receives one or more high level behavioral descriptions of an IC device (e.g., in HDL languages like VHDL, Verilog, etc.) and translates this high level design language description into netlists of various levels of abstraction. At a higher level of abstraction, a generic netlist is typically produced based on technology independent primitives. The generic netlist can be translated into a lower level technology-specific netlist based on a technology-specific library that has gate-specific models for timing and power estimation, for instance. A netlist is a description of the electronic circuit which specifies what cells compose the circuit and which pins of which cells are to be connected together using wires ("nets"). Importantly, the netlist does not specify where on a circuit board or silicon chip the cells are placed or where the wires run which connect them together. A netlist describes the IC design and is composed of nodes (elements) and edges, e.g., connections between nodes, and can be represented using a directed cyclic graph structure having nodes which are connected to each other with signal lines. A single node can have multiple fan-ins and multiple fan-outs. The netlist is typically stored in computer readable media within the EDA system and processed and verified using many well known techniques.

FIG. 1 illustrates a typical integrated circuit design netlist that includes a number of hierarchical organized cells including a top level block 40 having a number of lower level circuit blocks 10–30 within. Each circuit block 10–30 includes a number of cells and or other blocks.

Once the netlist is complete, the actual physical size, dimensions, geometry and placement of the cells within the blocks can be determined. geometric information is the function of an automatic placement process and an automatic routing process, both of which are parts of the "physical design" process and are typically computer programs. The designer supplies the netlist into the computer implemented automatic cell placement process. The automatic placement computer program finds a location for each cell on a circuit board or silicon chip. The locations are specified, typically, in two dimensional spatial coordinates, e.g., (x, y) coordinates, on the circuit board or silicon chip. The locations are typically selected to optimize certain objectives such as wire length, wire routibility, circuit speed, circuit power consumption, and/or other criteria, and typically subject to the condition that the cells are spread evenly over the circuit board or silicon chip and that the cells do not overlap with each other. The output of the automatic cell placement process includes a data structure including the (x, y) position for each cell of the design.

Typically, placement is done in two steps including a first coarse placement process, then detailed a placement process. The coarse placement process finds approximate cell locations which optimize the desired metrics and spreads cells evenly across the silicon chip or circuit board. In the output data structure, some cells still overlap and no cells are in legal site locations, so the coarse placement needs to be legalized before the circuit can be fabricated. The detailed placement inputs the data structure output by the coarse placement and generates the detailed placement which does not have overlap and all are located on legal sites.

Next, the designer supplies the netlist and the cell location data structure, generated by the placement program, to a computer implemented automatic wire routing process. This computer program generates wire geometry within data structure. The wire geometry data structure and cell placement data structure together are used to make the final geometric database needed for fabrication of the circuit.

In executing the above physical design programs or "design tools," many low level commands with associated parameters, options, variables and target databases are required. In some instances, up to 1,000 of these commands may be required to merely place one block. The commands perform low level functions for the design tools, e.g., a placer, such as: 1) initializing the placer for placement; 2) performing placement on a block; 3) evaluating the result; 4) formatting the data so that it can be understood; and 5) preparing the data for the next stage in the physical design process. Therefore, while the concept of performing a placement on a block can be abstracted to a high level operation, the actual commands given to the design tool to implement that operation are quite volumous.

Furthermore, physical design tools need to be executed on each block separately and then on the whole design. Separate sets of commands are required for each block that is to be processed. During the placement, other design tools may be required to check for any design rule violations or to perform optimizations, or to add special resources such as clocks and power lines, etc. The above process is then repeated for routing. As a result, multiple sets of commands are required for each physical design process to be completed and these commands are repeated over each block. In short, the actual command set required of the designer to merely place and route the netlist 40 of FIG. 1 may require tens of thousands of low level commands which need to be input to the physical design tools in a particular order.

In an effort to address the daunting task of managing these commands, chip designers have written small "execute" programs that function to access a block of the netlist and depending on which block is obtained, apply a predetermined set of commands to the block involving the physical design tools. Once a block is processed, the next one is automatically obtained. Loops can be placed in the programs for processing multiple blocks in the same way, e.g., using the same set of commands. However, the computer time required to perform a place and route on a typical design is very long. Should there be a problem with the execute program, or a problem with the placement or routing of the netlist, or a problem in one of the commands, then the entire execute program needs to be re-run from scratch once the problem is isolated and fixed. Therefore, this prior art approach is not very efficient in the face of design errors or program bugs which are always present. Furthermore, although this prior art approach helps to automate some of the designer's job, it still requires that in the development or modification of the execute program, the designer needs to use and edit the low level, voluminous detailed commands. As such, this development process can be tedious, error-prone and time consuming.

Another prior approach to solving the problem of dealing with these low level commands is utilize a program such as the UNIX Make, which is well known and commercially available. The program, Make, allows dependency graphs to be used indicating the input and the output of certain nodes, with each node representing a design tool task to be performed. In order to place and route the netlist, the graphs are analyzed to determined which nodes need which data and the appropriate node execution is then performed in the order dictated by the data dependencies. On subsequent re-runs of the netlist, if a node's input has not changed since the last run, then the node is not executed and its output is similarly re-used. Although offering efficient executions, this prior approach requires that the entire physical design process be hand-coded in the low level commands required of the design tools. This approach does not offer any flexibility in dealing with similar blocks or in adding or deleting or modifying commands because any such activity must be performed by hand, with an editor, directly on the low level commands. For instance, to run the same design tool over various blocks requires that the same code be block copied for each block, e.g., using an editor. To change a variable or parameter within the design tools requires that the code portion relating to that design tools be identified and manually modified. Again, this approach is very tedious, error-prone and time consuming.

SUMMARY OF THE INVENTION

Accordingly, what is needed is a system and method for providing the flexibility offered by the "execute programs" while still providing the execution efficiency offered by the dependency graphs described above. What is further needed is an efficient user interface for presenting the functionality of sophisticated integrated circuit design tools to allow their full exploitation by the user. The present invention provides these advantages and others not specifically mentioned above but described in the sections to follow.

Embodiments of the present invention are directed towards a method for implementing a user interface for performing physical design operations on an integrated circuit netlist. Embodiments of the method implement a snapping process for snapping blocks of cells to a grid of power and ground lines within the area of a chip (integrated circuit die). The snapping process provides for the snapping dimensions of the plurality of blocks to the grid such that the dimensions of the blocks align with the grid. The user interface also implements a process of using keystones and attach points to define connectivity relationships between the blocks. The connectivity relationships are defined by graphically linking the attach points of the respective blocks and updating the input file in accordance with the defined connections. Loose fly lines are displayed to graphically depict connection relationships between each of the plurality of blocks. The graphical depiction allows the alteration of the physical placement of the blocks in accordance with the revealed connectivity relationships. Master libraries and modifiable master libraries are used to match occurrences of elements within the netlist with their corresponding specifications, including those elements which do not have fixed definitions. The first master library comprises fixed elements having fixed specifications and the second modifiable library comprises modifiable elements having specifications which can change with each subsequent occurrence. The use of the two libraries allows the complete parsing of the input file (the integrated circuit netlist), thereby enabling a complete build of the integrated circuit netlist.

Specifically, a grid snapping embodiment of the present invention functions by accessing vertical and horizontal dimensions of an area of a chip and accessing a grid for power and ground lines of the chip. A view of the grid is then provided to the user on a computer display, for example, a CAD workstation display. A plurality of blocks of cells of the integrated circuit netlist are then accessed, each block representing circuit components to be realized in physical form. Dimensions of the plurality of blocks are "snapped" to the grid such that the dimensions of the blocks align with the grid. Thus the user can defined new dimensions and new configurations for the blocks while the interface ensures that any new dimensions are properly aligned with the grid. The dimensions of the plurality of blocks are controlled to align with the power and ground modulus of the grid such that the blocks can be linked to the power and grid lines in an interchangeable manner.

A keystone attach point embodiment of the present invention functions by accessing an input file containing identifications of a plurality of blocks of cells of said integrated circuit netlist and presenting a view of the plurality blocks to a user, the view provided by a computer display (e.g., CAD workstation display). Attach points for each block are defined and connections for the blocks are defined by graphically linking the attach points (the keystones) of the respective blocks. The linking is performed by, for example, tracing lines between the keystones using a mouse. Once linked, the input file is updated in accordance with the defined connections. The attach points for each block are graphically depicted by the view and are at predefined locations at each block (e.g., in each corner, etc.). Alternatively, the attach points can be graphically linked by the user via a textual command line interface. In either case, the view of the plurality of blocks can be updated in accordance with the newly defined connections to graphically reflect the defined connections.

A loose fly lines display embodiment of the present invention functions by accessing the input file (for the integrated circuit netlist), presenting a view of the plurality blocks to a user (e.g., CAD workstation display), and graphically depicting connection relationships between the plurality of blocks. The depiction of the connection relationships between the plurality of blocks is altered in accordance with a number of logical elements connected between the quality of blocks. The depiction visually shows connectivity relationships of the integrated circuit netlist. The number of logical elements connected between the plurality of blocks for generating the corresponding depiction is user adjustable (e.g., depending upon clutter, complexity, etc.). The type of logical elements connected between the plurality of blocks for generating the corresponding depiction is also user adjustable. The graphical depiction of connectivity relationships is used to change and/or fine-tune the physical placement configuration of at least one of the plurality of blocks to achieve a more efficient build placement.

A master library/modifiable master library embodiment of the present invention functions by accessing an input file of the integrated circuit netlist and parsing the input file to identify elements within the netlist matching corresponding elements within a first library file (master library file). At least one element within the netlist is identified, wherein the element does not have a corresponding element within the master library file. A modifiable element corresponding to the at least one element is stored within a second library file (modifiable master library file). A subsequent occurrence of the at least one element is identified within the netlist and the subsequent occurrence is matched to the modifiable element in the modifiable master library file. The parsing of the input file of the integrated circuit netlist is then completed, wherein each element comprising the input file matches corresponding elements in the first, master library or the second, modifiable master library. This allows a build of the integrated circuit netlist to be completed based on the parsed input file and specifications stored in the first library or the second library. The master library comprises fixed elements having fixed specifications, while the modifiable master library comprises modifiable elements having specifications which can change with each subsequent occurrence. The modifiable master library file contains definitions of element abstracts which can be extended in accordance with multiple occurrences of the element abstracts within the integrated circuit netlist.

BRIEF DESCRIPTION OF THE DRAWINGS

The present invention is illustrated by way of example and not by way of limitation, in the figures of the accompanying drawings and in which like reference numerals refer to similar elements and in which:

FIG. 14 shows a flowchart of the steps of a master library/modifiable master library parsing process in accordance with one embodiment of the present invention.

DETAILED DESCRIPTION OF THE INVENTION

Figure 1:
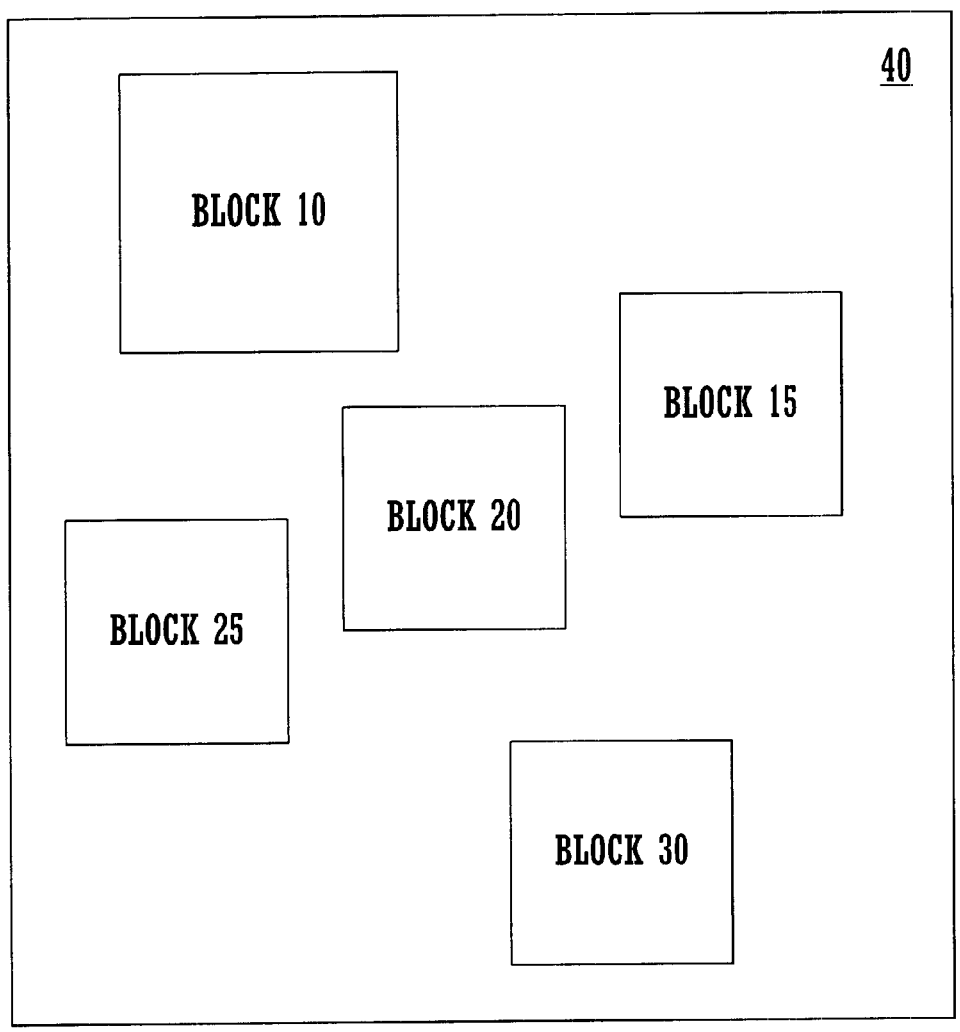
FIG. 1 illustrates a prior art netlist of an integrated circuit including a hierarchical organization of cell blocks including a top level block and several lower level blocks.

Reference will now be made in detail to the embodiments of the invention, a method and system for implementing a user interface for performing physical design operations on an integrated circuit netlist, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to obscure aspects of the present invention unnecessarily.

Notation and Nomenclature

Some portions of the detailed descriptions which follow are presented in terms of procedures, steps, logic blocks, processing, and other symbolic representations of operations on data bits within a computer memory. These descriptions and representations are the means used by those skilled in the data processing arts to convey most effectively the substance of their work to others skilled in the art. A procedure, computer executed step, logic block, process, etc., are here, and generally, conceived to be self-consistent sequences of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing," "accessing," "snapping," "accessing," "instantiating," "determining," "displaying," "defining," or the like, refer to the action and processes of a computer system, or similar electronic computing device, that manipulates and transforms data represented as physical (electronic) quantities within the computer system's registers and memories into other data similarly represented as physical quantities within the computer system registers or memories or other such information storage, transmission, or display devices.

Computer System Environment

Figure 2:
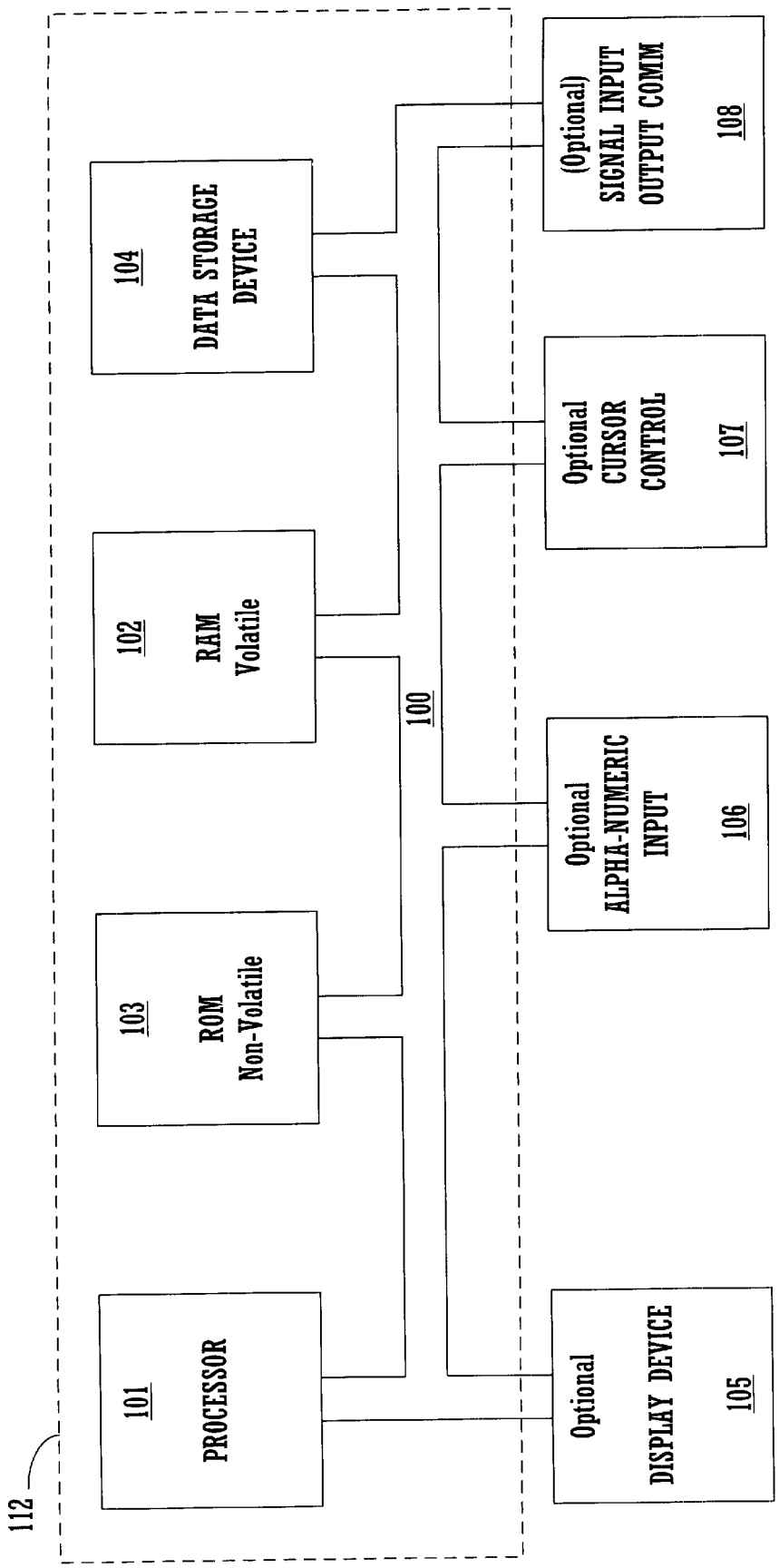
FIG. 2 is a block diagram of a general purpose computer aided design (CAD) system that can be used as a platform to implement various embodiments of the present invention.

Referring to FIG. 2, a computer system 112 is illustrated. Within the following discussions of the present invention, certain processes and steps are discussed that are realized, in one embodiment, as a series of instructions (e.g., software program) that reside within computer readable memory units of system 112 and executed by processors of system 112. When executed, the instructions cause computer system 112 to perform specific actions and exhibit specific behavior which is described in detail to follow.

Specific aspects of the present invention are operable within a programmed computer aided design (CAD) system. A CAD system operable to implement the elements of the present invention is shown in FIG. 2. In general, the CAD system of the present invention includes an address/data bus 100 for communicating information, one or more central processor(s) 101 coupled with bus 100 for processing information and instructions, a computer readable volatile memory unit 102 (e.g., random access memory, static RAM, dynamic RAM, etc.) coupled with bus 100 for storing information and instructions for the central processor(s) 101, a computer readable non-volatile memory unit 103 (e.g., read only memory, programmable ROM, flash memory, EPROM, EEPROM, etc.) coupled with bus 100 for storing static information and instructions for processor(s) 101. System 112 can optionally include a mass storage computer readable data storage device 104, such as a magnetic or optical disk and disk drive coupled with bus 100 for storing information and instructions. Optionally, system 112 can also include a display device 105 coupled to bus 100 for displaying information to the computer user, an alphanumeric input device 106 including alphanumeric and function keys coupled to bus 100 for communicating information and command selections to central processor(s) 101, a cursor control device 107 coupled to bus for communicating user input information and command selections to the central processor(s) 101, and a signal input/output device 108 coupled to the bus 100 for communicating messages, command selections, data, etc., to and from processor(s) 101.

Program instructions executed by the CAD system can be stored in RAM 102, ROM 103, or the storage device 104 and, when executed in a group, can be referred to as logic blocks or procedures. It is appreciated that data produced at the various logic synthesis stages of the present invention, including representations of the different levels of abstraction of the integrated circuit design, can also be stored in RAM 102, ROM 103, or the storage device 104 as shown in FIG. 2.

The display device 105 of FIG. 2 utilized with the computer system 112 of the present invention may be a liquid crystal device, cathode ray tube, or other display device suitable for creating graphic images and alphanumeric characters recognizable to the user. The cursor control device 107 allows the computer user to signal dynamically the two dimensional movement of a visible pointer on a display screen of the display device 105. Many implementations of the cursor control device are known in the art including a trackball, mouse, joystick, or special keys on the alphanumeric input device 105 capable of signaling movement of a given direction or manner of displacement.

Graphical User Interface for Implementing Grid Snapping

Figure 3:
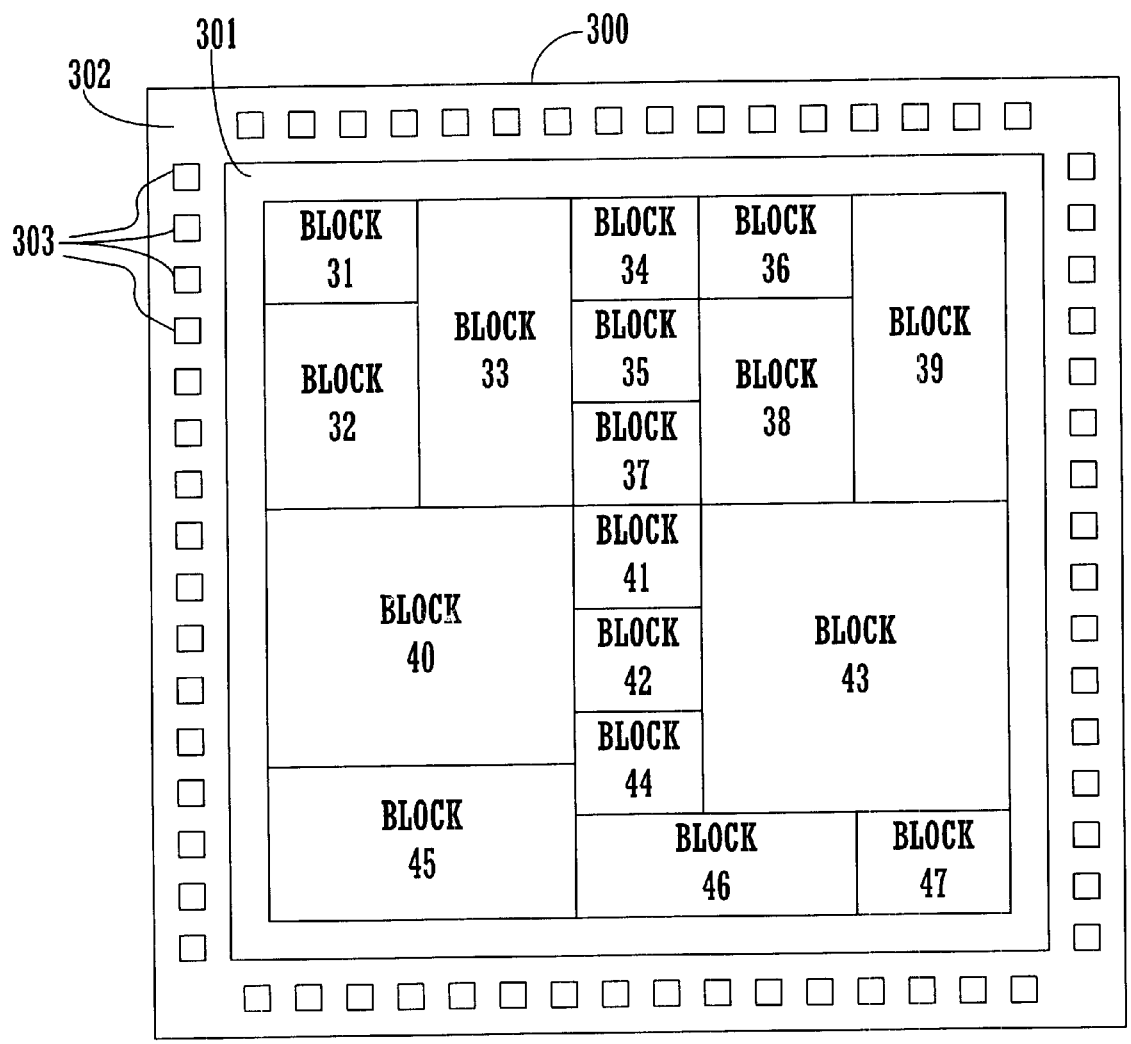
FIG. 3 shows a diagram of integrated circuit die in accordance with one embodiment of the present invention.

Referring now to FIG. 3, a diagram of an integrated circuit die 300 is shown. As depicted in FIG. 3, integrated circuit die 300 includes an outer peripheral area 302 having a series of contact pads 303. Within the peripheral area 302 is a functional block area 301 including a series of blocks of cells, blocks 31–47. Each of the blocks 31–47 comprise integrated circuit components (e.g., gates, buffers, storage elements, etc.) which implement functionality of the integrated circuit die 300. Each circuit block 31–47 includes a number of cells and/or other blocks.

The physical size, dimensions, geometry and placement of the blocks 31–47 of integrated circuit die 300 is performed by an automatic placement process and an automatic routing process, both of which are parts of the "physical design" process and are typically computer programs. For example, the designer supplies the netlist into the computer implemented automatic cell placement process. The automatic placement computer program finds a location for each cell on a circuit board or silicon chip. The locations are specified, typically, in two dimensional spatial coordinates, e.g., (x, y) coordinates, on the circuit board or silicon chip. The locations are typically selected to optimize certain objectives such as wire length, wire routibility, circuit speed, circuit power consumption, and/or other criteria, and typically subject to the condition that the cells are spread evenly over the circuit board or silicon chip and that the cells do not overlap with each other. The output of the automatic cell placement process includes a data structure including the (x, y) position for each of the blocks 31–47 and each of the cells of the respective blocks 31–47 of integrated circuit die 300.

Referring still to FIG. 3, the present invention provides a graphical user interface for presenting the functionality of place and route EDA software to a user (e.g., a physical design engineer). The place and route EDA software is used for floor planning the configuration of the blocks 31–47 of integrated circuit die 300. It is advantageous to optimize use of the surface area of die 300. The floor planning technology of the present invention uses "abutted block" technology in determining the configuration and layout of blocks 31–47. Abutted block technology avoids the use of channels between blocks for routing interconnections. This avoids crosstalk problems as the area devoted to channels become smaller and smaller as integrated circuit dies reach higher levels of integration. Using abutted block technology, interconnections are routed directly through blocks 31–47 using pin assignments. The pin assignments are used to track the location of the interconnection points on each of blocks 31–47. The routing tool of the present invention places interconnections through the actual circuitry comprising each of the blocks such that once the blocks are laid out (e.g., as shown in FIG. 3), all interconnection pins are in their correct location.

Thus, the place and route EDA software needs to ensure the blocks 31–47 are properly configured dimension-wise, and are properly laid out in their correct locations. In accordance with the present invention, a GUI for the place and route EDA software is configured to use "grid snapping" to constrain block locations and prevent incorrect block placement/configuration. The grid snapping functionality constrains the dimensions and placement of blocks 31–47 such that they can only be certain discrete sizes in accordance with design constrains for integrated circuit die 300. Such constraints include requirements for evenly distributing power and ground to the cells comprising each of blocks 31–47.

Figure 4:
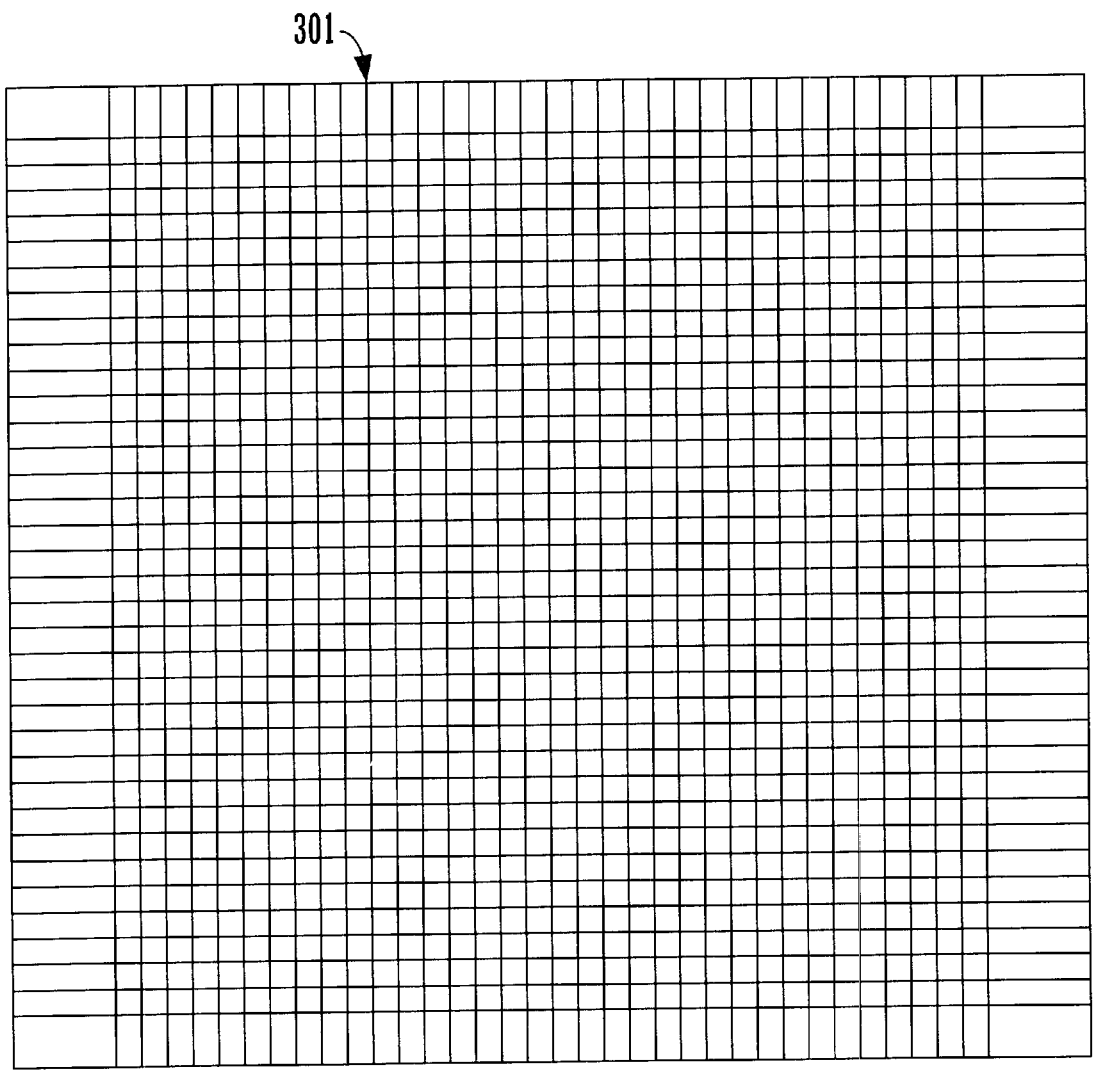
FIG. 4 shows a diagram of a functional block area of an integrated circuit die in accordance with one embodiment of the present invention.

Referring now to FIG. 4, a diagram of functional block area 301 of integrated circuit die 300 is shown. As depicted in FIG. 4, the diagram of functional block area 301 shows the standard cell row power and ground rails and vertical standard cell power and ground stripes. The standard cell row power and ground rails are depicted as a series of horizontal power and ground lines crossing block area 301 horizontally, from side to side. The vertical standard cell power and ground stripes are depicted as a series of power and ground lines crossing block area 301 vertically, from top to bottom. The power and ground rails and stripes are used to distribute power and ground evenly across the cells of each of blocks 31–47. Each rail and stripe alternates, power and ground, across block area 301. The grid snapping functionality of the present embodiment constrains the sizes and configuration of blocks 31–47 such that the block boundaries occur on double row heights and double row widths.

Figure 5:
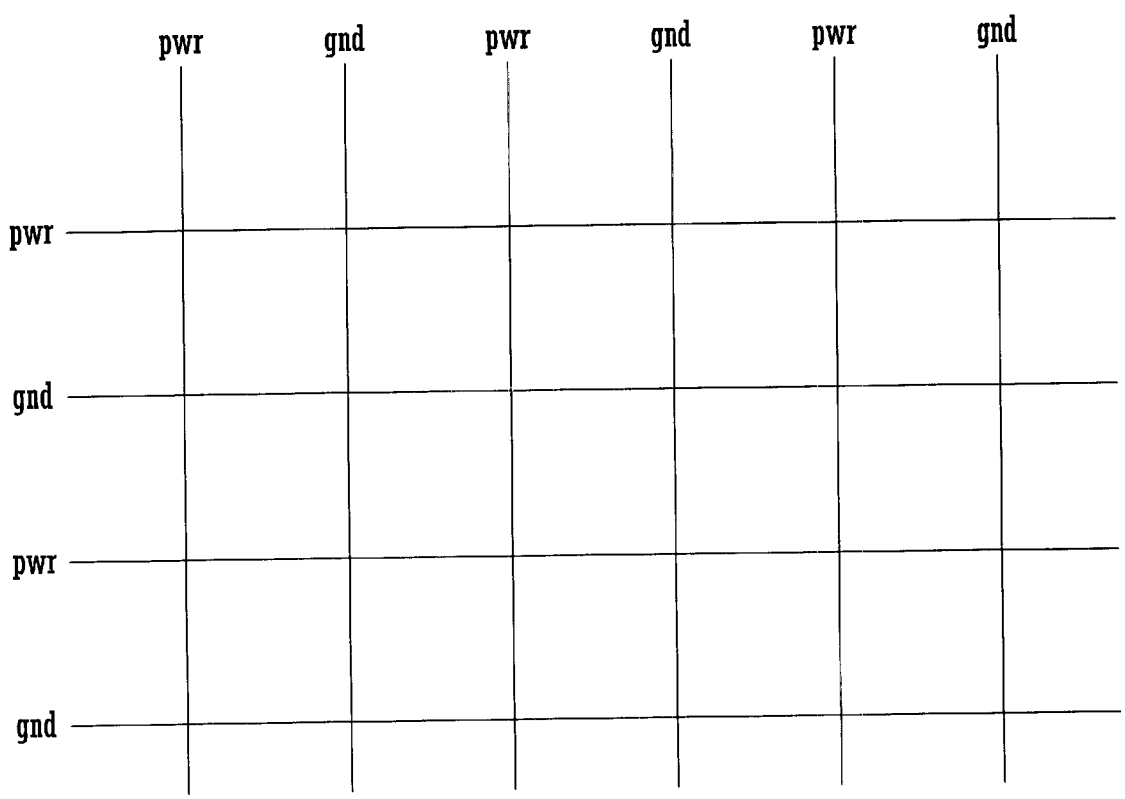
FIG. 5 shows power and ground rails and power and ground stripes of a block area of an integrated circuit die in accordance with one embodiment of the present invention.

FIG. 5 shows the power and ground rails/stripes of block area 301 in greater detail. With respect to standard cell rows, the blocks 31–47 share the power rails and ground rails with one another. In order to preserve interchangeability, such that the blocks can be picked up and moved around or otherwise reconfigured, the block boundaries have to stack to a standard cell row such that the power and ground interconnections to the power and ground rails will align. This is to avoid splitting any block along a row. In the present embodiment, for maximum interchangeability, the blocks should stack to double row heights of the power/ground modulus.

With respect to standard cell vertical stripes, the vertical stripes alternate power and ground. In the present embodiment, the widths of each of blocks 31–47 is constrained to multiples of power and ground pairs to avoid splitting of a block along any column. Thus, the dimensions of blocks 31–47 can only take discrete sizes in accordance with the grid of power and ground lines depicted in FIG. 4. These constraints are enforced by the GUI by snapping dimensions of the blocks to the grid.

Figure 6:
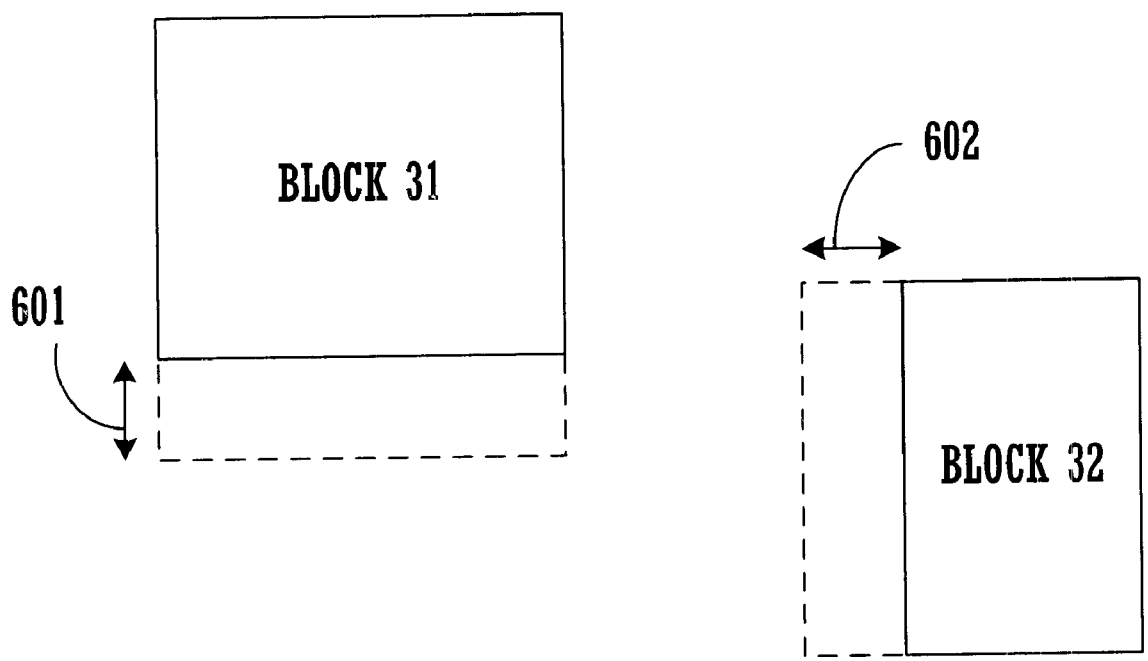
FIG. 6 shows a diagram depicting grid snapping functionality has performed on functional blocks in accordance with one embodiment of the present invention.

FIG. 6 depicts the snapping functionality as performed on block 31 and block 32. As described above, an engineer can alter the dimensions of any of the blocks 31–47, for example, as the configuration of integrated circuit 300 is being updated. FIG. 6 depicts an alteration of the dimensions of block 31 and block 32 as shown on, for example, display device 105 of computer system 112. For example, block 31 is constrained to discrete vertical sizes in accordance with the grid of block area 301 (e.g., the power and ground modulus). This shown by arrow 601. Similarly, block 32 is constrained to discrete horizontal sizes in accordance with the grid of block area 301, as shown by arrow 602. The dimensions of the blocks 31–32 can be changed, for example, through the user controlling a cursor control 107, in conjunction with display device 105, of computer system 112 (shown in FIG. 2).

Figure 7:
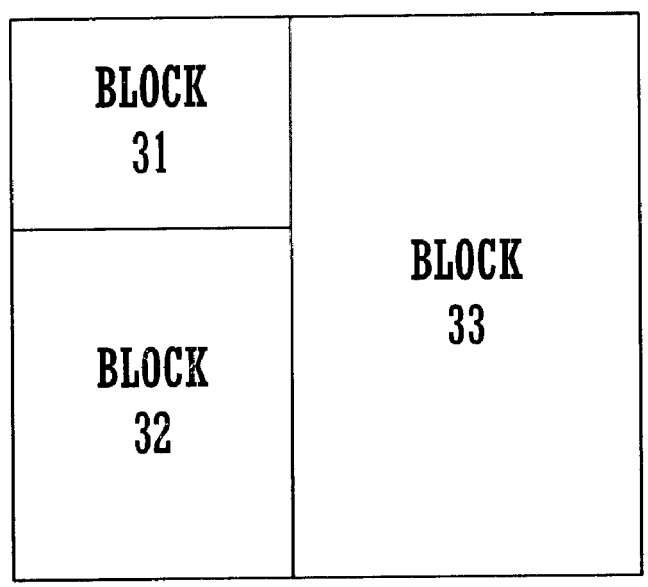
FIG. 7 shows dimensions of functional blocks as constrained by the grid snapping functionality of the present invention.

Referring now to FIG. 7, blocks 31–33 are shown. Thus, since the dimensions of blocks 31–47 are constrained by the snapping functionality of the GUI to ensure proper alignment with the power and ground pairs of block area 301, the blocks 31–47 are substantially interchangeable. Using the GUI, a user can pick up one block and move it to another location, swap blocks, interactively change relative sizes of the blocks, or the like, in order to make a most optimum use of block area 301. Hence, the edges shared by blocks 31–33 shown in FIG. 7 can be altered through the GUI by the user without fear of disrupting power and ground interconnections.

Figure 8:
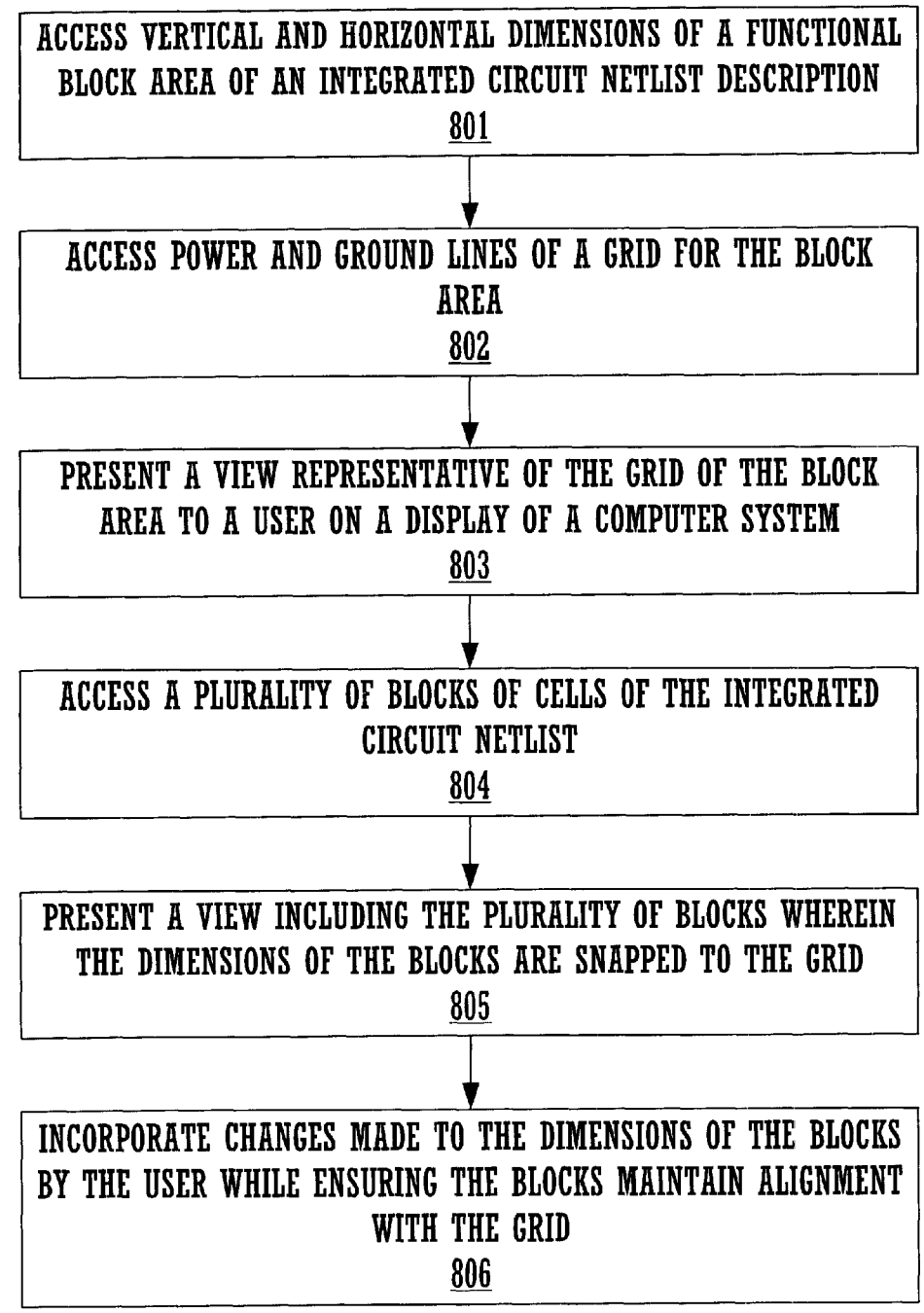
FIG. 8 shows a flow chart of the steps of a graphical user interface grid snapping process in accordance with one embodiment of the present invention.

FIG. 8 shows a flowchart of the steps of a GUI grid snapping process 800 in accordance with one embodiment of the present invention. Process 800 depicts the operating steps performed by the GUI executing on a computer system (e.g., computer system 112) as the GUI interacts with a user to change/alter the configuration of blocks of a netlist.

Process 800 begins in step 801, where an EDA program accesses vertical and horizontal dimensions of an area of a netlist of a chip. In step 802, the program accesses a grid for power and ground lines of the netlist. In step 803, a view of the grid is then provided to the user on a computer display, for example, a CAD workstation display (e.g., display device 105 of FIG. 2). In step 804, a plurality of blocks of cells of the integrated circuit netlist are then accessed, each block representing circuit components to be realized in physical form.

Referring still to FIG. 8, in step 805, in presenting the view, dimensions of the plurality of blocks are "snapped" to the grid such that the dimensions of the blocks align with the grid. Thus the user can define new dimensions and new configurations for the blocks while the interface ensures that any new dimensions are properly aligned with the grid. In step 806, as the user makes changes to the configurations and/or alignments of the blocks, the dimensions of the blocks are controlled to align with the power and ground modulus of the grid such that the blocks can be linked to the power and ground lines in an interchangeable manner.

Graphical User Interface for Implementing Keystones

In the process of designing circuit blocks 31–47, the GUI of the present invention presents a view into a database containing/storing the design data comprising blocks 31–47. To facilitate the straightforward input and alteration of connection and configuration information for blocks 31–47, the GUI presents a view of the database (e.g., one or more blocks) wherein each view has basic keystones.

Figure 9:
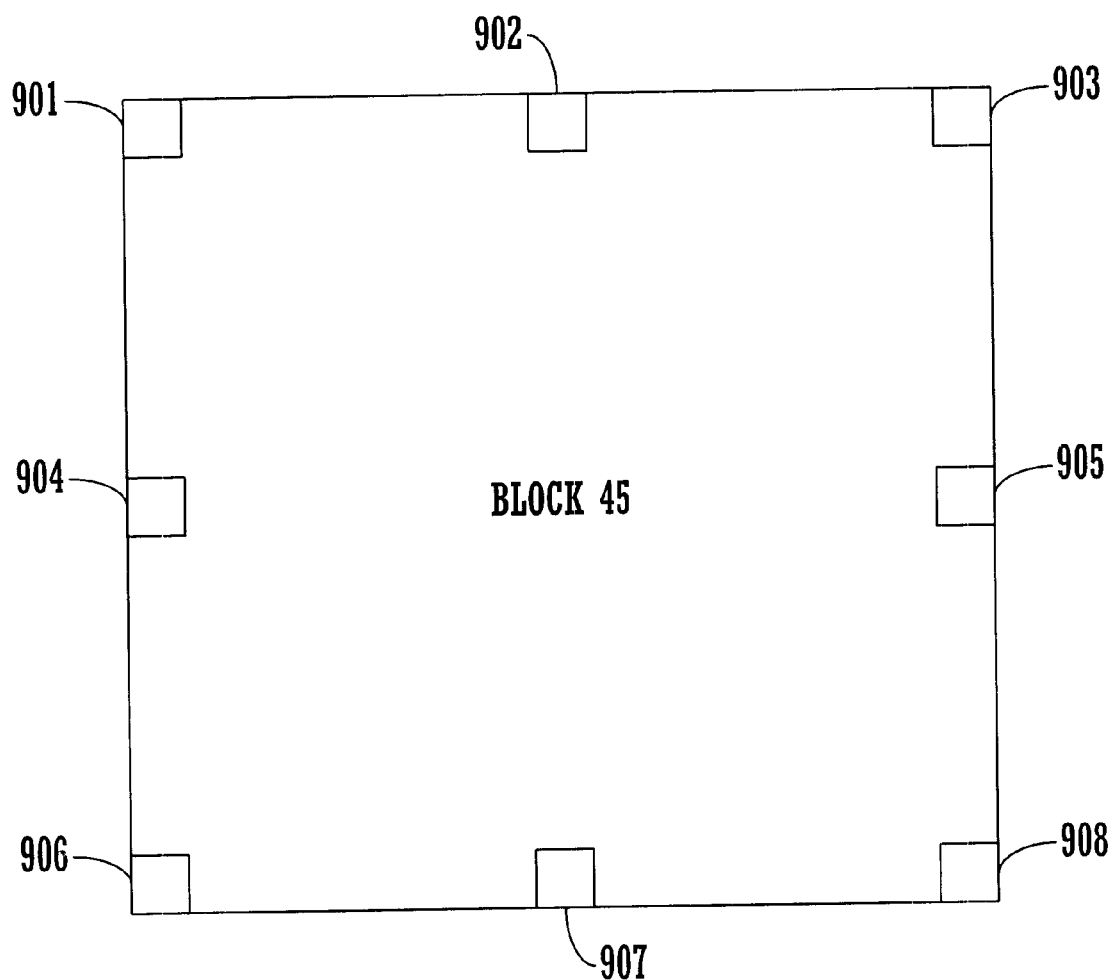
FIG. 9 shows a view of a block having keystone attach points as presented on a display device to the user in accordance with one embodiment of the present invention.

FIG. 9 shows a view of a block (e.g., block 45) as presented on display device 105 to the user. In accordance with the keystone implementation of the present embodiment, the view has keystones provided at standard locations. The locations are shown in FIG. 9 as keystones 901–908. The locations are standardized in order to facilitate defining connection points for blocks 31–47 (e.g., upper left 901, upper center 902, upper right 903, etc.). The orientation and connectivity of the blocks 31–47 is defined by the connections between their respective keystones. Users can define connections by linking the keystones, for example, by drawing lines between respective keystones using cursor control device 107 of computer system 112. This shown in FIG. 10 below.

Figure 10:
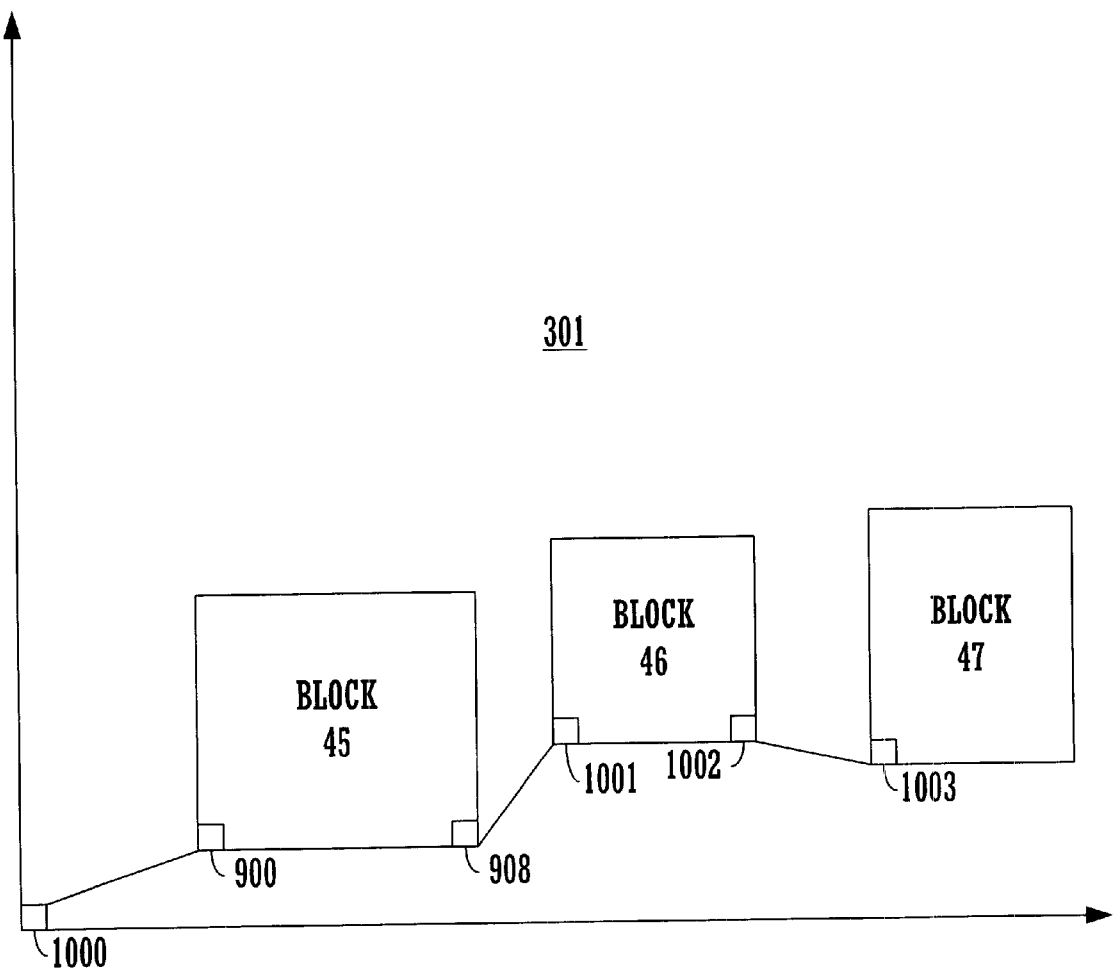
FIG. 10 shows a depiction of keystone links in operation in accordance a with one embodiment of the present invention.

In FIG. 10, a depiction of a keystone linking operation in accordance with the GUI the present embodiment is shown. The view shown in FIG. 10 shows the lower left keystone 1000 of a view of block area 301 (in this case, the lower left corner of block area 301). Within this view, three blocks, blocks 45–47, are shown. The user defines connections and locations for blocks 45–47 by linking specific keystones of the blocks. This is shown as lines between respective keystones. For example, FIG. 10 shows keystone 906 linked to the bottom left keystone 1000 of the view (in this case, the view being block area 301). Similarly, keystone 908 of block 45 is linked to keystone 1001 of block 46, and keystone 1002 of block 46 is linked to keystone 1003 of block 47. By linking the keystones, the user has defined the connection and location relationships of blocks 45–47 with respect to the view, block area 301. This is shown in FIG. 11 below.

Figure 11:
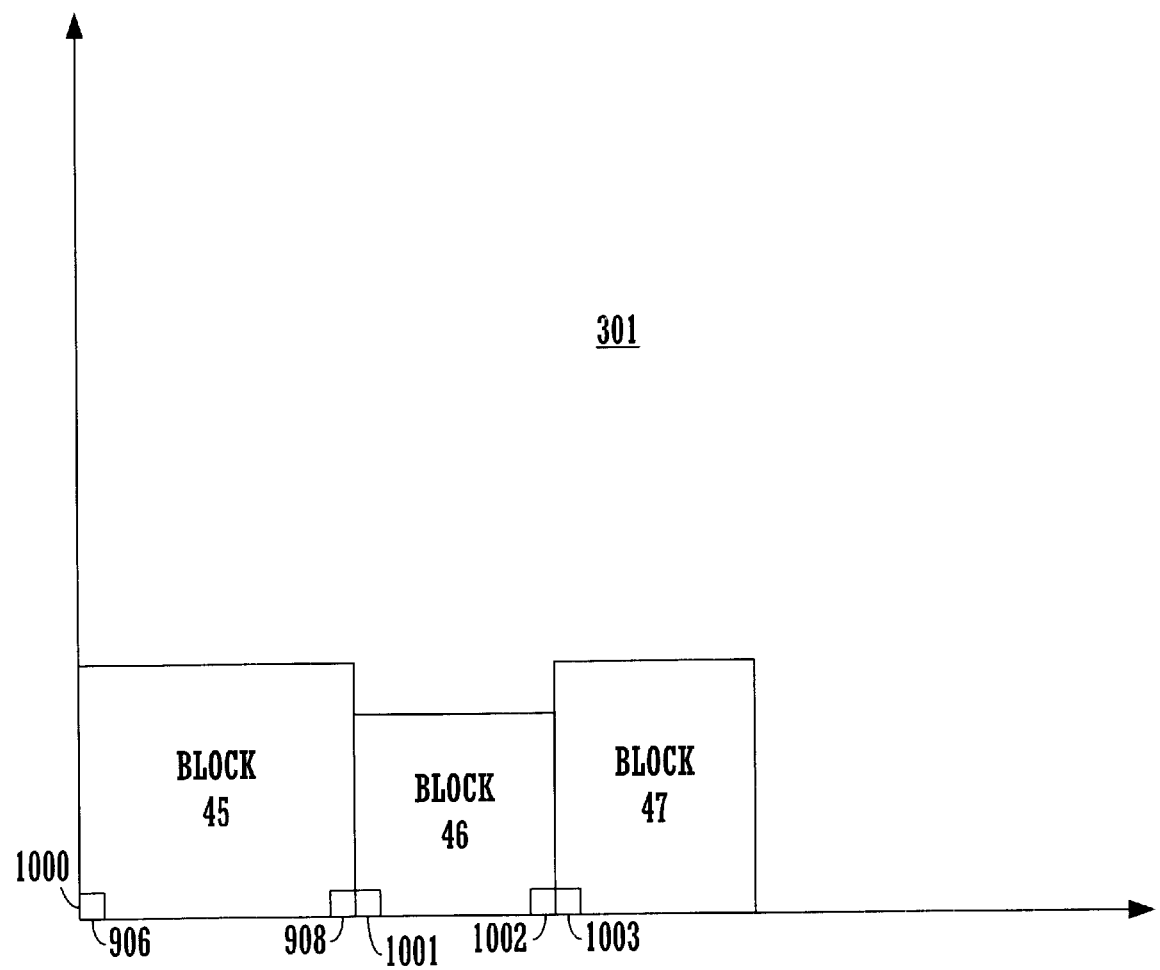
FIG. 11 shows linked blocks bound to locations defined by their keystone connections in accordance with one embodiment of the present invention.

FIG. 11 shows blocks 45–47 bound to the locations defined by their connections. As described above in FIG. 10, the user previously defined connection and location relationships of blocks 45–47 by linking certain keystones in the manner shown in FIG. 10. Once linked, the user can instruct the GUI (e.g., pressing a button, selecting a menu item, etc.) to bind blocks 45–47 to their linked locations, as shown in FIG. 11. Hence, the linked keystones of the blocks will move the blocks 45–47 to their specified locations in their specified connection relationships.

Thus, loosely arranged blocks can be connected by drawing lines between their respective keystones. The user then binds the blocks, the GUI automatically arranges the blocks in accordance with the connection shown by the lines. The blocks are snapped to the grid. The database then remembers the orientation of the blocks. Blocks connected in this manner are referred to as stacks. A stack of blocks can be moved as if they are one, with the computer system 112 moving the connected blocks in order to reestablish the correct orientation.

It should be noted that the GUI interacts with the database in order to make the keystone behavior occur. The user can also implement the same functionality by entering command line instructions to the database, accomplishing same result in that manner, as opposed to graphically drawing lines between the keystones using cursor control device 107. The entering of command line instructions is referred to as entering constraint language commands. Constraint language defines how the blocks are supposed to be tiled together. Constraint language is also referred to as tiling language. An example command line instruction would be "connected block A lower left to block B upper left" as entered by, for example, the user through alphanumeric input device 106 (e.g., the keyboard). The GUI of the present embodiment has the advantage over command line based constraint language entry in that the GUI is intuitive to the user and provides immediate visual feedback of any changes/corrections to the orientation of blocks. The database is where all the design information is maintained, all the connection information, placement information, grid information, and the like. The GUI of the present embodiment functions as a front end to the database.

Figure 12:
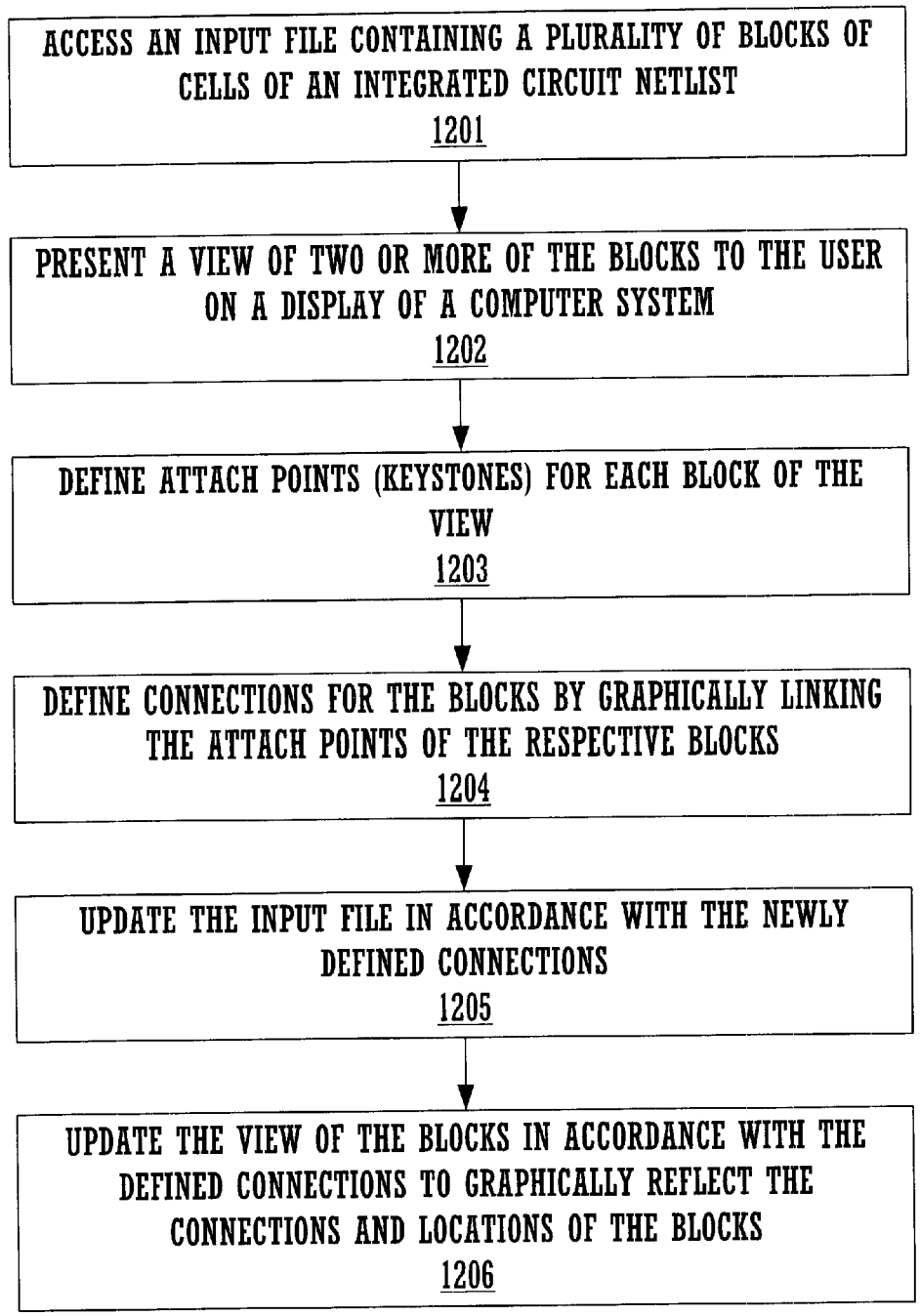
FIG. 12 shows a flowchart of the steps of a GUI keystone process in accordance with one embodiment of the present invention.

FIG. 12 shows a flowchart of the steps of a GUI keystone process 1200 in accordance with one embodiment of the present invention. Process 1200 depicts the operating steps performed by the GUI executing on a computer system (e.g., computer system 112) as the GUI interacts with a user to change/alter the connection and location of blocks of a netlist by linking respective keystones.

Process 1200 begins in step 1201, where an EDA program in accordance with the present invention accesses an input file containing identifications of a plurality of blocks of cells of an integrated circuit netlist. In step 1202, a view of two or more of the plurality blocks (e.g., blocks 45–47) are presented to the user. As described above, the view is provided by a computer display (e.g., CAD workstation display). In step 1203, attach points for each block of the view are defined. As described above, the attach points, or keystones, are provided at standard locations on each block (e.g., keystones 901–908 shown in FIG. 9) and are graphically depicted by the view (e.g., in each corner, etc.).

Referring still FIG. 12, in step 1204, connections for the blocks are defined by graphically linking the attach points of the respective blocks. The lining is performed by, for example, tracing lines between the keystones using a mouse. In step 1205, once linked, the input file is updated in accordance with the defined connections. In step 1206, the view of the plurality of blocks is updated in accordance with the defined connections to graphically reflect the connections and locations. As described above, the user binds the blocks and the GUI automatically arranges the blocks in accordance with the connection shown by the lines. The blocks are snapped to the grid and the database then stores the location of the blocks.

Master Libraries and Modifiable Master Libraries

In completing a build of an integrated circuit netlist, a place and route tool needs to know the specifications of blocks (e.g., blocks 31–47) in order to route interconnections between the blocks and place the blocks geometrically on the silicon area. As the place and route tool lays out the blocks, those blocks which are not ready (e.g., blocks obtained from external vendors, unfinished blocks, blocks whose configuration is as yet unknown, etc.) need to be replaced with "placeholders" in order to allow the construction of the chip using the blocks which are ready. In the present embodiment, placeholders are replicas of actual blocks that include sufficient information to allow interconnections to be made, such that when the missing actual blocks are ready, they can simply be "dropped in" to the design. These placeholders are sometimes referred to as fake abstracts.

Figure 13:
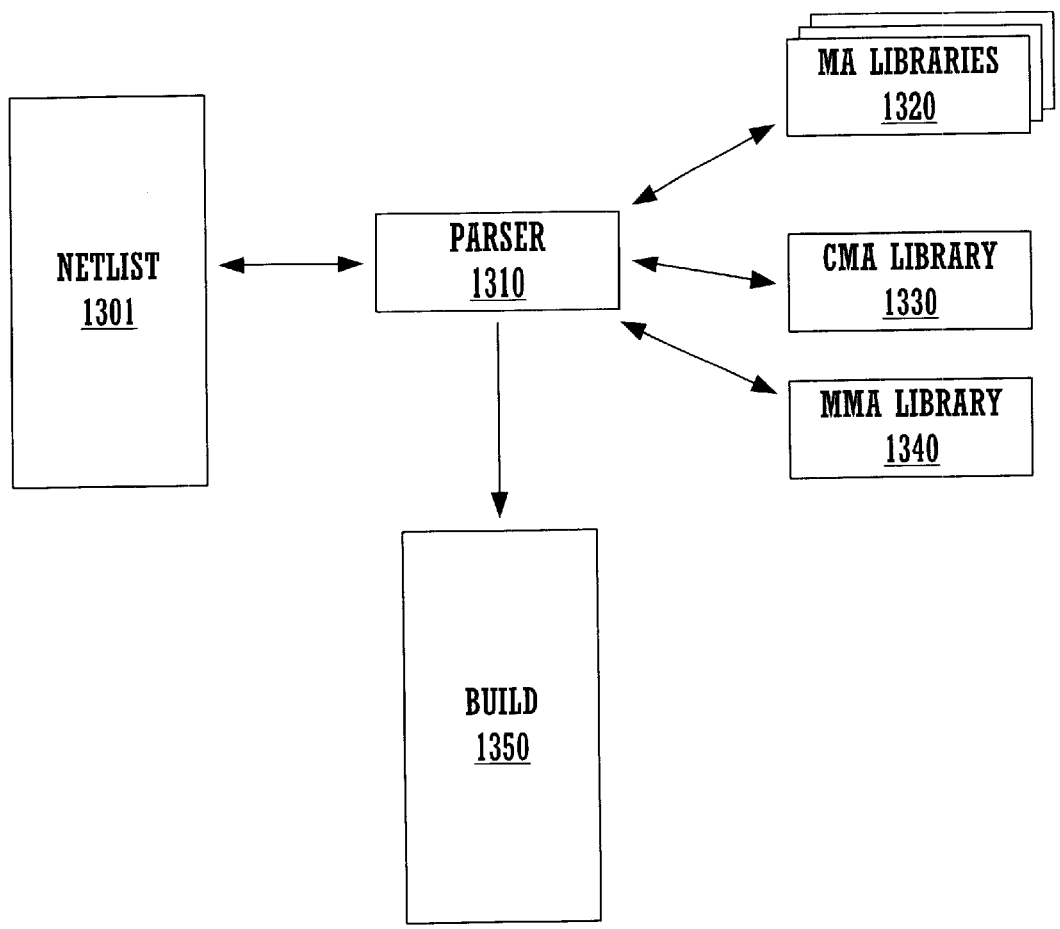
FIG. 13 shows a diagram of a hardware design language parsing process in accordance with one embodiment of the present invention.

Referring now to FIG. 13, a diagram of a hardware design language parsing process 1300 in accordance with one embodiment of the present invention is shown. Process 1300 depicts a parsing program 1310 of the present embodiment accessing and parsing a netlist 1301 of an integrated circuit device to be realized physical form (e.g., integrated circuit die 300). The parsing program analyzes netlist 1301 to identify macros, abstracts, elements, etc. within netlist 1301 and match them with their corresponding specifications stored in master libraries (MA libraries) 1320, created master libraries (CMA libraries) 1330, or modifiable master libraries (MMA libraries) 1340. Once matched, the specifications are retrieved and used to complete a build 1350 of integrated circuit device, having all the necessary place and route information required for making masks and completing fabrication of the device.

Hardware design language parsing as performed by parser 1310 is used to identify repeated macros and abstracts within netlist 1301. The master libraries 1320 contain definitions (e.g., specifications) of element abstracts and macros within a netlist description. Elements correspond to hardware items used to build up a block (e.g., RAM, multiplexer, adder, or the like). The parser 1310 is used to review the netlist 1301 to ensure the place and route tool understands the elements within the netlist 1310 and can connect their respective interconnections. When the parser encounters an abstract or macro that is not within the master libraries 1320, instead of failing as would be the case with conventional prior art parsers, parser 1310 takes the new abstract or macro and adds it to a special library, the created master library 1330, and continues parsing the netlist 1301. Subsequent encounters with the same abstract refer back to the corresponding entry in the created master library 1330.

However, if a new instance of the abstract occurs (such as the same element with a new net or new interconnection), where a conventional prior art parser would still fail, parser 1310 of the present embodiment uses the modifiable master library 1340 to allow new elements or abstracts to be modified once they're created. An example would be a new instance of a RAM with more of its storage elements connected and used. For instance, while parsing netlist 1301, the parser encounters a new abstract/macro, for example, a RAM. The new abstract/macro is stored within a created master library 1330 and is given a name (e.g., RAM 16 by 32), and the parser 1310 continues parsing the netlist 1301. The parser 1310 subsequently encounters an abstract having same name (e.g., RAM 16 by 32) but having new nets, the abstract/macro (master name) is modified to include the new nets and is stored within modifiable master library 1340. This prevents the parser 1310 from falling and the build 1350 of the chip from failing to complete. This allows abstract/macros to change and include new nets or have fewer nets as engineers working on the abstract/macro continue to modify or tweak the design while also allowing the build of the top-level chip to proceed without waiting on all the details of the abstract/macro to be finalized. An example would be the new version of the abstract missing ports that the overall chip expects to connect to. The parser 1310 in accordance with the present invention would simply add the missing ports, modifying the modifiable master library 1340, and continue.

Referring still to FIG. 13, another feature is the fact that the modifiable feature of the modifiable master library 1340 can be turned off by the user. The ability to modify the masters can be selectively reduced as the chip nears completion. This forces the engineers to be increasingly precise in their definition, reflecting the fact that at some point in time the chip actually needs to be finalized so that it can be fabricated without bugs.

FIG. 14 shows a flowchart of the steps of a master library/modifiable library parsing process 1400 in accordance with one embodiment of the present invention. Process 1400 depicts the operating steps performed by the parsing program (e.g., parser 1310 of FIG. 13) of the present embodiment executing on a computer system (e.g., computer system 112) to complete a build of a chip (e.g., integrated circuit device 1350).

Process 1400 begins in step 1401, where an input file of the integrated circuit netlist (e.g., netlist 1301) is accessed. In step 1402, a parser begins examining the input file (e.g., netlist 1301) to identify elements within the input file matching corresponding elements within a first library file (e.g., master libraries 1320). In step 1403, at least one element within the netlist 1301 is identified, wherein the element does not have a corresponding element within the master library file 1320. In step 1404, a modifiable element corresponding to the at least one element is stored within a second library file (modifiable master library file 1340). In step 1405, a subsequent occurrence of the at least one element is identified within the netlist 1301 and the subsequent occurrence is matched to the modifiable element in the modifiable master library 1340.

Referring still to FIG. 14, in step 1406, the parsing of the input file of is then completed, wherein each element comprising the input file matches corresponding elements in the master libraries 1320 or the modifiable master libraries 1340. In step 1407, the matching performed in step 1406 allows a build of the integrated circuit netlist to be completed based on the parsed input file and specifications stored in the master libraries 1320 and modifiable master library 1340. As described above, The master library 1320 comprises fixed elements having fixed specifications, while the modifiable master library 1340 comprises modifiable elements having specifications which can change with each subsequent occurrence. The modifiable master library 1340 contains definitions of element abstracts which can be extended in accordance with multiple occurrences of the element abstracts within the integrated circuit netlist. It should be noted that the parsing process 1400 can also function with a third library, created master library 1320, which includes newly encountered elements not in the fixed master libraries 1320, but having specifications which do not change with subsequent occurrences.

Graphical User Interface for Implementing Loose Fly Lines Display

Once blocks are completed, design engineers need to find out how the blocks should be placed. In accordance with the present embodiment, one tool used for determining where blocks should be placed at how blocks to be connected is loose fly lines display.

Figure 15:
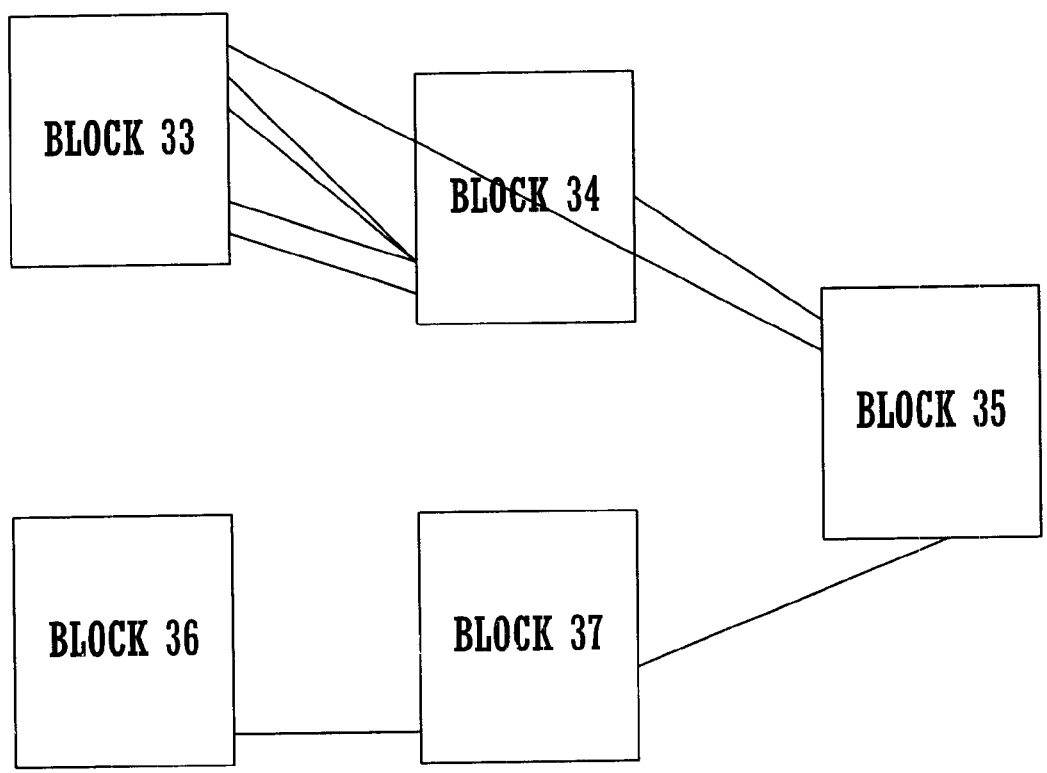
FIG. 15 shows a loose fly lines display as presented to a user on a display device in accordance with one embodiment of the present invention.

FIG. 15 shows a loose fly lines display as presented to a user on a display device in accordance with one embodiment of the present invention. As depicted in FIG. 15, blocks 33–37 are shown. Loose fly lines, lines between blocks 33–37, are also depicted. In accordance with the present embodiment, logical connections between blocks are graphically depicted as lines between one port of a block and another port of a block. The lines graphically depict the interconnection (e.g., signal lines, etc.) between blocks. The visual indications of the loose fly lines give design engineers clues as to the order in which blocks should be placed. Large numbers of loose fly lines between blocks means blocks need to be placed close to each other. Relatively smaller numbers of loose fly lines between blocks indicates less interconnectivity, and hence less of the need to place the blocks close together. For example, as shown in FIG. 15, blocks 33 and block 34 have a larger number of "fly lines" between them than blocks 34 and 37. Certain block types tend to have a much larger number of connections than other block types, such as RAMs and similar types of hard macros.

Figure 16:
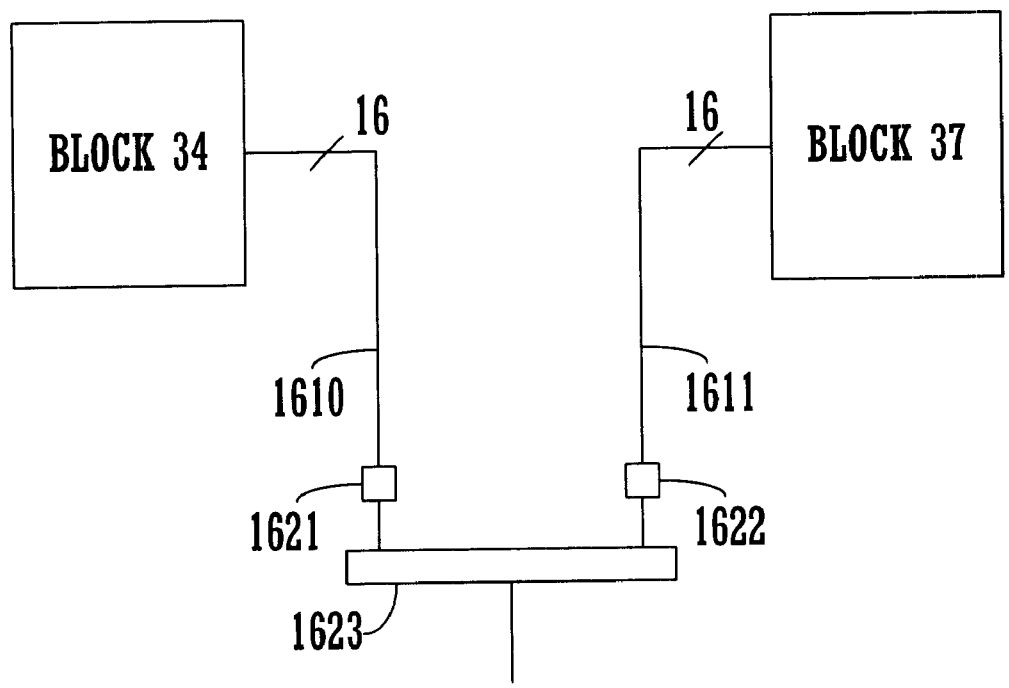
FIG. 16 shows a diagram of functional block types having intervening connection logic between them in accordance with one embodiment of the present invention.

Referring now to FIG. 16, there is a problem, however, where certain block types have intervening connection logic between them. The intervening connection logic between blocks, for example block 34 and block 37, could prevent fly lines showing the connection dependency from being displayed. One example would be two RAMs (block 34 and block 37) connected to each other via a multiplexer 1623, respective buffers 1621–1622, and 16-bit signal lines 1610–1611. Prior art type fly lines would show connections from a RAM to a multiplexer (a separate element) but may not show the connections between the two RAMs. The fly lines would not show connections from one RAM (block 34) to the next RAM (block 37).

Figure 17:
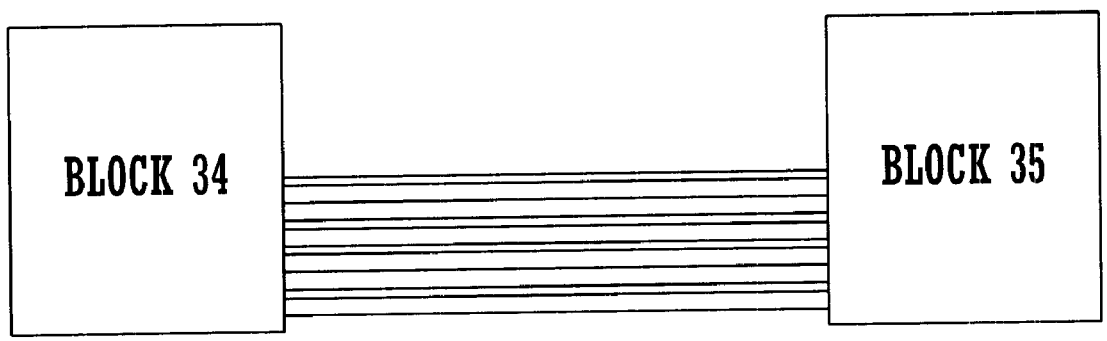
FIG. 17 shows a loose fly lines display as implemented between functional blocks having intervening connection logic between them in accordance with one embodiment of the present invention.

Referring now to FIG. 17, loose fly lines display as implemented in the present embodiment allows the display of connections between elements at different levels. For example, at level zero, fly lines are shown from element. At level one, fly lines are shown from element with one intervening element in between. Similarly, at level three, the fly lines would show one RAM a block 34 connected to the other RAM a block 37 even though the buffers 1621–1622 and multiplexer 1623 is intervening. Thus, as shown in FIG. 17, the relatively large a connectivity relationship between block 34 and block 37 shows as a large number of fly lines connecting the two, presenting clear visual evidence to the design engineers the blocks 34 and 37 should be located adjacently.

Thus, using loose fly lines displays as implemented by the GUI of the present embodiment, a design engineer would have the capability of showing loose fly lines at different levels, showing more loosely connected elements (intervening logic between them). Another example would be RAM were the output of the RAM is connected via a buffer and the multiplexer, yielding two levels of interconnection logic. Level one loose fly lines display would not show this interconnection, however, level two would show the relationship between the two RAMs. The fly lines can also show geometry within the block itself. For example connections on the low side of the block would have fly lines originating in going to the low side of the block. This allow engineers to determine whether the blocks needs to be flipped over, or placed on the other side of the connected block (e.g., a block having a large number of fly lines coming from its left side going to a block on the right to the right side).

Figure 18:
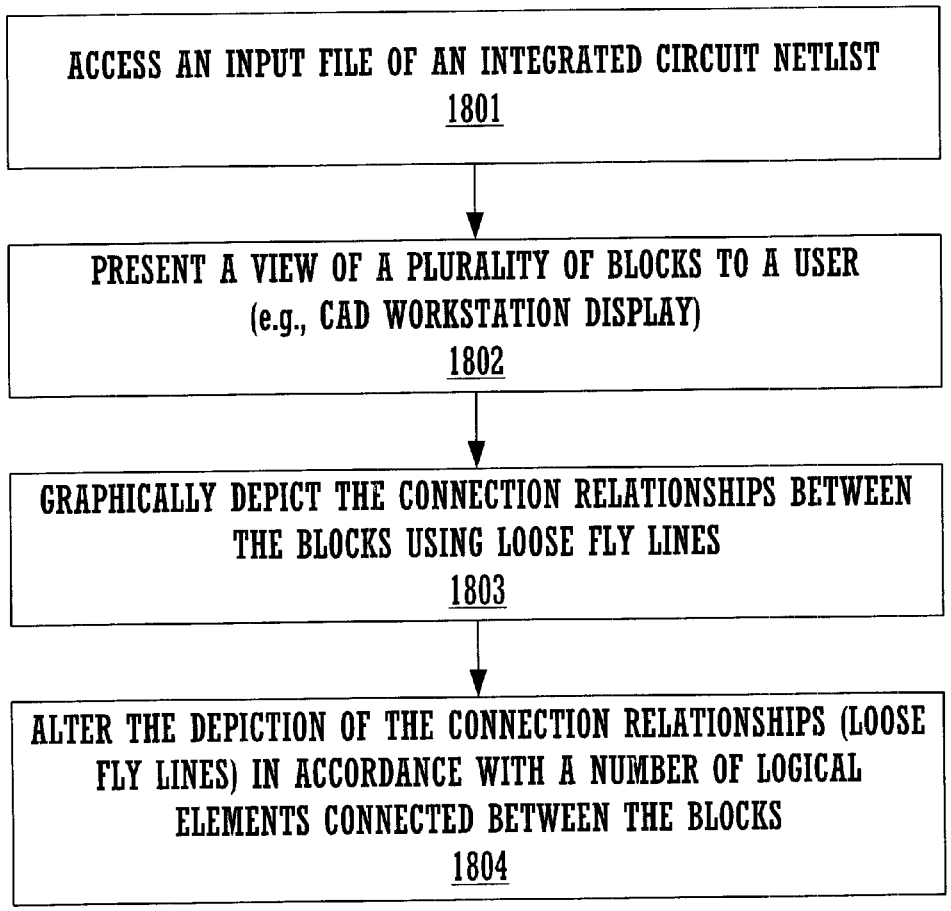
FIG. 18 shows a flowchart of the steps of a loose fly lines GUI display process in accordance with one embodiment of the present invention.

FIG. 18 shows a flowchart of the steps of a loose fly lines GUI display process 1800 in accordance with one embodiment of the present invention. The loose fly lines display process 1800 depicts the operating steps performed by a loose fly lines GUI as it interacts with a design engineer.

Process 1800 begins in step 1801, where the input file (for the integrated circuit netlist) is accessed. In step 1802, a view of the plurality blocks is presented to a user (e.g., CAD workstation display). In step 1803, connection relationships between the plurality of blocks is a graphically depicted. In step 1804, the depiction of the connection relationships between the plurality of blocks is altered in accordance with a number of logical elements connected between the quality of blocks. The depiction visually shows connectivity relationships of the integrated circuit netlist. As described above, the number of logical elements connected between the plurality of blocks for generating the corresponding depiction is user adjustable (e.g., depending upon clutter, complexity, etc.). Similarly, the type of logical elements connected between the plurality of blocks for generating the corresponding depiction is also user adjustable. In step 1805, the graphical depiction of connectivity relationships is used to change and/or fine-tune the physical placement configuration of at least one of the plurality of blocks to achieve a more efficient build placement.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, thereby to enable others skilled in the art best to utilize the invention and various embodiments with various modifications as are suited to the particular use contemplated. It is intended that the scope of the invention be defined by the claims appended hereto and their equivalents.

What is claimed is:

1. A method for implementing a user interface for performing physical design operations on an integrated circuit netlist, comprising:

a) accessing an input file containing identifications of a plurality of blocks of cells of said integrated circuit netlist, each block representing circuit components to be realized in physical form;

b) presenting a view of the plurality blocks to a user, the view provided by a computer display;

c) graphically depicting connection relationships between the plurality of blocks; and d) altering the depiction of the connection relationships between the plurality of blocks in accordance with a number of logical elements connected between the plurality of blocks to show connectivity relationships of the integrated circuit netlist, wherein the depiction of step c) can be adjusted to different hierarchical levels to show the connection relationships at a higher level or a lower level.

2. The method of claim 1 wherein the number of logical elements connected between the plurality of blocks for generating the corresponding depiction is user adjustable.

3. The method of claim 1 wherein the type of logical elements connected between the plurality of blocks for generating the corresponding depiction is user adjustable.

4. The method of claim 1 wherein the physical placement configuration of at least one of the plurality of blocks is altered in accordance with the depiction of the connection relationships between the plurality blocks.

5. A computer readable media for use with a computer system having a processor coupled to a memory via a bus, the computer readable media having computer readable code stored thereon, which when executed by the computer system, cause the computer system to perform a method for implementing a graphical user interface for depicting loose fly line interconnections between multiple blocks of an integrated circuit netlist, the method comprising:

a) accessing an input file containing identifications of a plurality of blocks of cells of said integrated circuit netlist, each block representing circuit components to be realized in physical form;

b) presenting a view of the plurality blocks to a user, the view provided by a computer display;

c) graphically depicting connection relationships between the plurality of blocks; and d) altering the depiction of the connection relationships between the plurality of blocks in accordance with a number of logical elements connected between the plurality of blocks to show connectivity relationships of the integrated circuit netlist, wherein the depiction of step c) can be adjusted to different hierarchical levels to show the connection relationships at a higher level or a lower level.

6. The computer readable media of claim 5 wherein the number of logical elements connected between the plurality of blocks for generating the depiction from step c) is user adjustable.

7. The computer readable media of claim 6 wherein the type of logical elements connected between the plurality of blocks for generating the depiction from step c) is user adjustable.

8. The computer readable media of claim 7 wherein the physical placement configuration of at least one of the plurality of blocks is altered in accordance with the depiction of the connection relationships between the plurality blocks.

9. The computer readable media of claim 5 wherein the depiction of step c) comprises a line between one element of one of the plurality of blocks and another element of another one of the plurality of blocks.

10. The computer readable media of claim 5 wherein the depiction of step c) can be adjusted to graphically depict the connection relationships between blocks having intervening logic therebetween.

11. The computer readable media of claim 5 wherein the depiction of step c) depicts connection relationships between respective ports of the plurality of blocks.

12. A CAD (computer aided design) design synthesis system for implementing a graphical user interface for depicting loose fly line interconnections between multiple blocks of an integrated circuit netlist, comprising:

a computer system including a processor coupled to a volatile memory and a non-volatile memory, the volatile and non-volatile memories for containing computer readable software which when executed by the computer system cause the computer system to implement a method for depicting loose fly line interconnections between multiple blocks of an integrated circuit netlist via a graphical user interface, the method comprising the computer implementing the steps of:

a) accessing an input file containing identifications of a plurality of blocks of cells of said integrated circuit netlist, each block representing circuit components to be realized in physical form;

b) presenting a view of the plurality blocks to a user, the view provided by a computer display;

c) graphically depicting connection relationships between the plurality of blocks; and d) altering the depiction of the connection relationships between the plurality of blocks in accordance with a number of logical elements connected between the plurality of blocks to show connectivity relationships of the integrated circuit netlist, wherein the depiction of step c) can be adjusted to different hierarchical levels to show the connection relationships at a higher level or a lower level.

13. The CAD system of claim 12 wherein the number of logical elements connected between the plurality of blocks for generating the depiction from step c) is user adjustable.

14. The CAD system of claim 13 wherein the type of logical elements connected between the plurality of blocks for generating the depiction from step c) is user adjustable.

15. The CAD system of claim 12 wherein the physical placement configuration of at least one of the plurality of blocks is altered in accordance with the depiction of the connection relationships between the plurality blocks.

16. The CAD system of claim 12 wherein the depiction of step c) comprises a line between one element of one of the plurality of blocks and another element of another one of the plurality of blocks.

17. The CAD system of claim 12 wherein the depiction of step c) can be adjusted to graphically depict the connection relationships between blocks having intervening logic therebetween.

18. The CAD system of claim 12 wherein the depiction of step c) depicts connection relationships between respective ports of the plurality of blocks.

* * * * *